United States Patent [19]

Lee

[11] Patent Number: 4,634,890
[45] Date of Patent: Jan. 6, 1987

[54] CLAMPING CIRCUIT FINDING PARTICULAR APPLICATION BETWEEN A SINGLE SIDED OUTPUT OF A COMPUTER MEMORY AND A DIFFERENTIAL AMPLIFIER SENSING CIRCUIT

[75] Inventor: Robert D. Lee, Denton, Tex.

[73] Assignee: Thomson Components-Mostek Corporation, Carrollton, Tex.

[21] Appl. No.: 648,092

[22] Filed: Sep. 6, 1984

[51] Int. Cl.[4] .............................................. H03K 17/16
[52] U.S. Cl. ............................. 307/200 B; 307/443; 307/452; 307/496; 307/530; 307/358; 307/548
[58] Field of Search ................... 307/200 B, 443, 448, 307/451, 452, 491, 494, 496, 497, 530, 358–359, 548, 579, 585, 297, 554, 557; 330/253, 261

[56] References Cited

U.S. PATENT DOCUMENTS

| 4,024,418 | 5/1977 | Hankel | 307/451 X |
| 4,071,777 | 1/1978 | Herrmann | 307/494 |
| 4,074,151 | 2/1978 | Buckley, III et al. | 307/448 X |
| 4,114,055 | 9/1978 | Hollingsworth | 307/530 |
| 4,160,176 | 7/1979 | Takahashi | 307/200 B X |
| 4,434,381 | 2/1984 | Stewart | 307/530 |

Primary Examiner—Stanley D. Miller
Assistant Examiner—D. R. Hudspeth
Attorney, Agent, or Firm—Roland Plottel

[57] ABSTRACT

A transistor arrangement for clamping the output node of a semiconductor memory, including an inverter to parallel with a transmission gate for producing a differential output signal.

3 Claims, 6 Drawing Figures 4,634,890

CLAMPING CIRCUIT FINDING PARTICULAR APPLICATION BETWEEN A SINGLE SIDED OUTPUT OF A COMPUTER MEMORY AND A DIFFERENTIAL AMPLIFIER SENSING CIRCUIT

TECHNICAL FIELD

The field of the invention is that of voltage clamping circuits for voltage side sensing circuits at the output of low drive current, highly capacitive state indicating devices, such as semiconductor memories, for example.

BACKGROUND ART

The detection of output state signals from highly capacitive, low drive current state indicating devices, such as a semiconductor memory, requires output signal levels from the device to be near the midrange of the trigger threshold of the sense amplifiers performing the detection operation. The output node of a cell in a semiconductor memory, such as for example a read only memory (ROM), can be connected directly to the sense amplifier.

However, such a directly connected arrangement would be unacceptably slow and unresponsive in producing a meaningful output, because the output node of the memory is highly capacitive. In particular, the output node would have to be slewed from a level near ground potential or the level of the device bias voltage, and beyond the trip point of the sensing circuit before a meaningful output indication could be established.

Accordingly, it is an object of the invention herein to develop a technique for clamping the output node of a semiconductor memory to permit effective output signal detection.

DISCLOSURE OF INVENTION

According to the invention herein, this is accomplished by clamping the single-sided output signal node of the memory cell near the trip point of an inverter, the output node being directly connected to the input of the inverter and a transmission gate being connected between the input and output of the inverter.

BRIEF DESCRIPTION OF DRAWINGS

The invention herein is best understood with reference to the attached drawing, wherein.

BEST MODE FOR CARRYING OUT THE INVENTION

Figure 1:
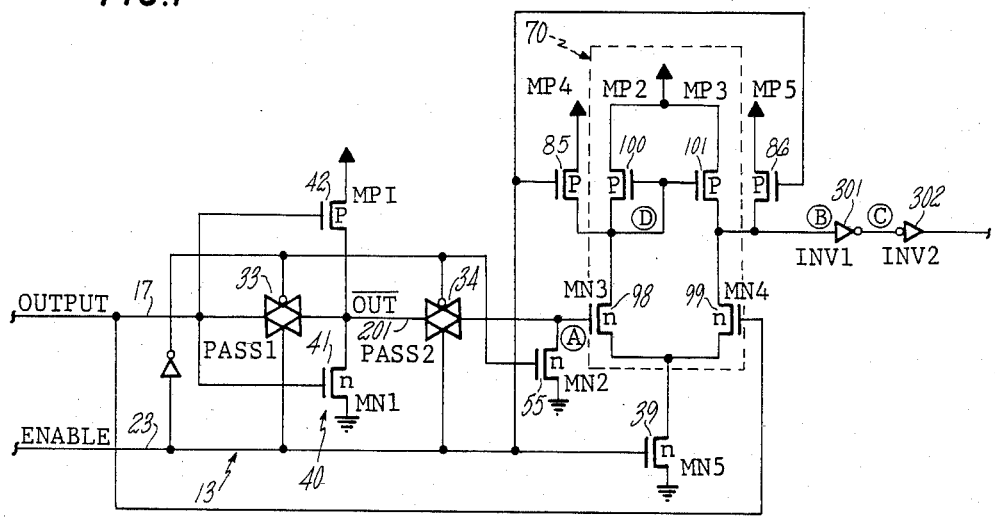
FIG. 1 is a schematic of the clamping circuitry and differential sense amplifier according to the invention.

FIG. 1 shows a clamping circuit 13 according to the invention, including an output node 17 from a state driving device such as for example a semiconductor memory cell (not shown). When the ENABLE line 23 of the device is set low, transmission gates 33 and 34 (respectively PASS1 and PASS2) and MOS transistor 39 (MN5) are turned off. Inverter 40, of clamping circuit 13, including respective n- and p-channel transistors 41 and 42, thus does not have its input gates connected to its output through the closed circuit resistance of transmission gate 33. Further, node A to sense amplifier 70 is held low by transistor 55 (MN2). Additional circuitry (not shown) will cause node 17 to go to ground when the clamping circuit 13 is turned off or deselected.

As is well known in the art, a transmission gate such as transmission gates 33 and 34 are for example parallel n-channel and p-channel transistors with their respective gates connected to suitable control inputs, and their inputs and outputs connected. Thus, instead of an input zero voltage producing an output $V_{TP}$ level (as with a p-channel device), or an input five (5) volts producing an output level of $5-V_{TN}$ (as with an n-channel device alone), a zero input produces a zero output, and a five volt input (for example) produces a five volt output with the parallel device.

Additionally, nodes D and B of differential sense amplifier 70 are held high by transistors 85 and 86, respectively MP4 and MP5. As a consequence, transistors 98 and 99, respectively MN3 and MN4 have identical voltages applied to their gate and drain nodes, with the result that any extensive or long-life voltage threshold or thermal shifts will be matched and equal. This minimizes offset drift in transistors MN3 and MN4. Additionally, p-channel transistors 100 and 101 complete the scheme of establishing a differential sense amplifier. The gates of transistors 100 and 101 are connected to each other and to node D, insuring that the currents through the respective transistors 100 and 101 are equal, in accordance with the well known current mirror effect.

Figure 2:
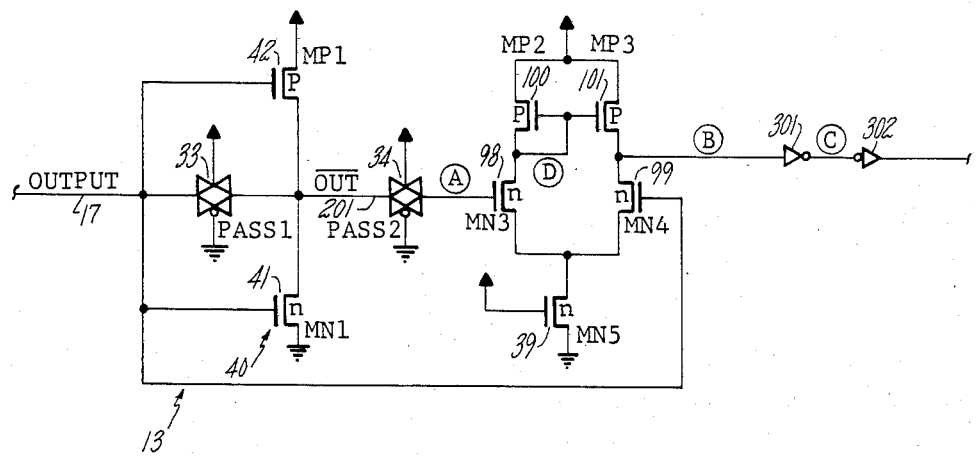
FIG. 2 is a reduced version of the circuitry in FIG. 1, when the ENABLE signal switches on the clamping circuitry and the sense amplifier.
Figure 3:
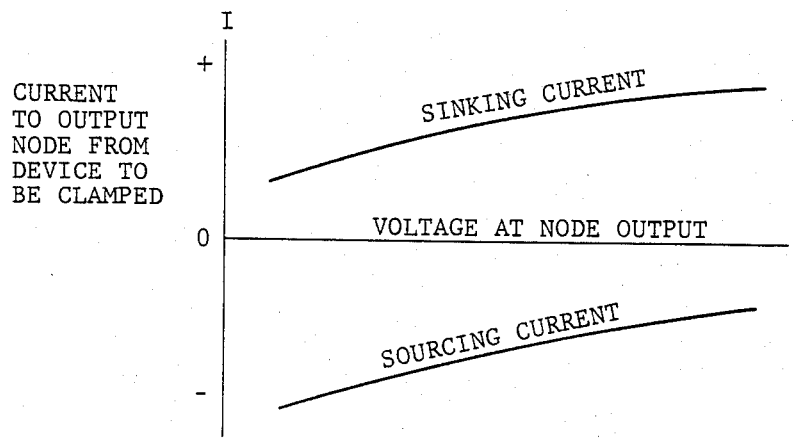
FIG. 3 is a graph showing the output drive current as a function of node 17 output voltage from an arbitrary state changing device either sinking or sourcing current.

With the ENABLE line 23 set high, FIG. 1 reduces to the arrangement shown in FIG. 2. In such a reduced state, the clamping arrangement produces a responsive sink or source current through transfer gate 33 (PASS1), depending upon whether the memory device (not shown) connected to node 17 is sourcing or sinking current with respect to the node 17, as generally suggested in FIG. 3 for an arbitrary device at node 17. Accordingly, an output current/voltage relationship is established looking into PASS1 from the output node 17 in which the source current holding the output node 17 up is reduced with increasing output node voltage starting at ground. Current reaches zero (0), as shown in FIG. 3, when the output node voltage equals the trip voltage of the MP1/MN1 inverter 122 including CMOS transistors 134 and 135, one of them being a p-channel device and the other being an n-channel device. The responsive sink current holding output node 17 down increases as the node voltage continues increasing beyond the trip point of the inverter output voltage, finally leveling off to a constant level, as shown in FIG. 3.

Figure 4:
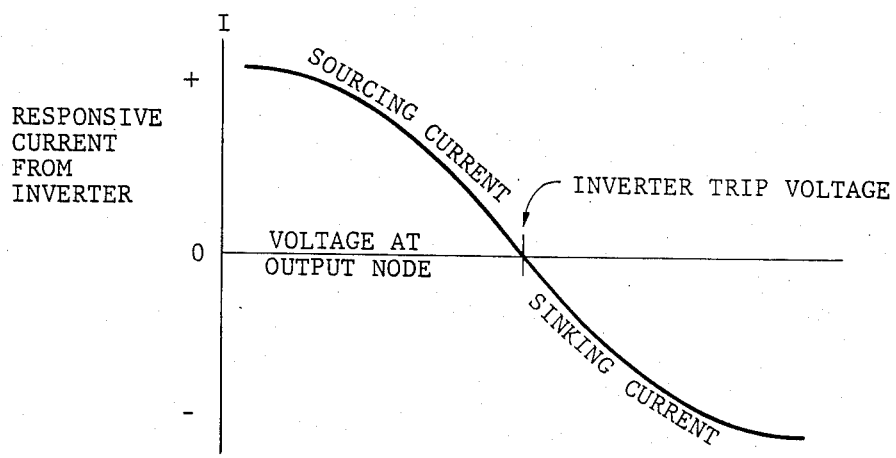
FIG. 4 is a graph showing the responsive current from the inverter 40 input gates and transmission gate 33.
Figure 5A:
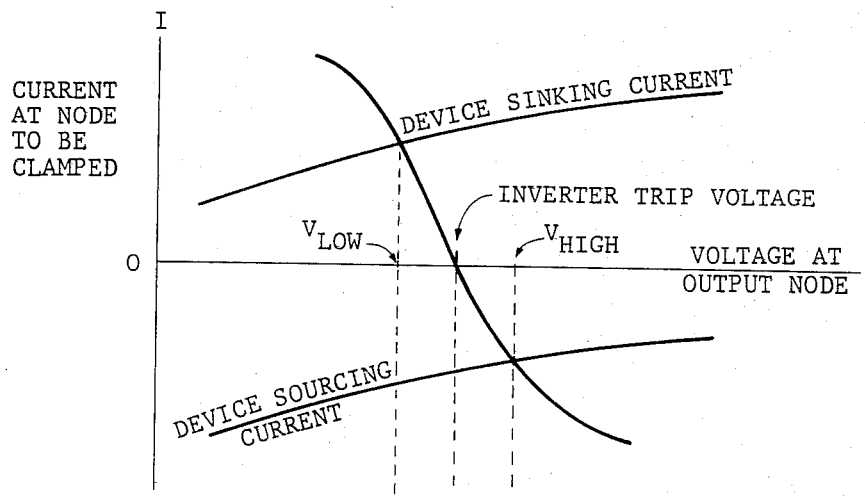
FIG. 5A combines FIGS. 3 and 4 to show that the output node voltage is clamped between $V_{low}$ and $V_{high}$ as a result of the invented circuitry.
Figure 5B:
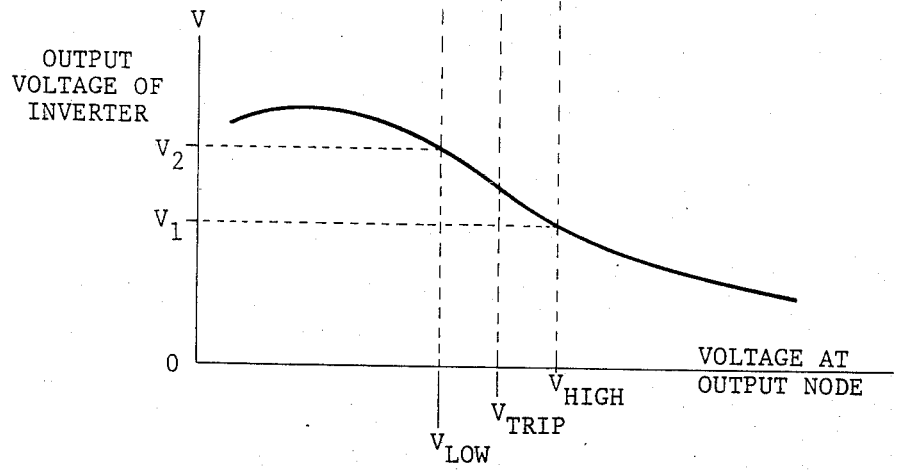
FIG. 5B shows the output voltage from the inverter 40 in response to a range of input voltages.

By superimposing the respective curves of FIG. 3 and FIG. 4, it is possible to generate first FIG. 5A, and then FIG. 5B, which depicts the swing of the voltage at OUT node 201 with respect to the voltage at output node 17. These figures show that when the clamping circuit 13 sinks current, node output 17 will be clamped to the level $V_{low}$. With output node 17 at $V_{low}$, the OUT node 201 will be at $V_2$. When the ROM sensing circuit 70 sources current, output node 17 will be clamped at $V_{high}$. With output node 17 at $V_{high}$, OUT node 201 will be at $V_1$. Thus, output node 17 is clamped near the trip point of inverter 40 and is effective for producing a differential output, of greater magnitude than the single sided input signal could produce.

The differential signal between output node 17 and OUT node 201 (OUT being passed through PASS2 to node A) is applied to differential sense amplifier 70 including transistors 98 through 101. The differential amplifier 70 amplifies the differential signal applied between its respective positive and negative input nodes and drives output inverter 301, and inverter 301 in turn drives inverter 302.

In summary, the circuit of this invention clamps node 17 near the trip point of inverter 40, and produces a differential signal, which is applied to the differential inputs of differential sense amplifier 70. A differential output voltage between node 17 and A, which can reverse its polarity depending upon whether node 17 is subject to a source or sinking current, is thus produced. Transmission gate 33 (PASS1) will not change from sourcing current to sinking current, until the voltage across it changes polarity, which can only happen as the output node 17 crosses the trip point of inverter 40. The voltage across transmission gate 33 is the differential voltage applied to sense amplifier 70. This differential voltage changes polarity as transmission gate 33 changes between sinking current and sourcing current states of operation.

The above information may lead others skilled in the art to conceive of other embodiments of the invention, which nonetheless fall within the scope of the invention. Accordingly, it is urged that reference be made to the claims which follow, as these point out the metes and bounds of the invention with particularity.

I claim:

1. A clamping circuit for connection between a single sided output of a memory and the twin inputs of a differential amplifier sensing circuit comprising:
   a CMOS inverter including a pair of complementary transistors serially connected and an output at the node between the two transistors with the input of each transistor coupled to the single sided output,
   a first transmission gate whose input is connected to the single-sided output and whose output is connected to the output of the inverter,
   a second transmission gate whose input is connected to the output of the invertor and whose output is connected to one of the twin inputs of the differential amplifier, the other of the twin inputs being connected to said single-sided output; and
   means for synchronously enabling the first and second transmission gates.

2. The clamping circuit of claim 1 in combination with said differential amplifier.

3. The combination of claim 2 in which the differential amplifer is enabled in synchronism with the enabling of the transmission gates.

* * * * *